United States Patent [19]

Itzkan

[11] Patent Number: 4,468,279
[45] Date of Patent: Aug. 28, 1984

[54] METHOD FOR LASER MELTING OF SILICON

[75] Inventor: Irving Itzkan, Boston, Mass.

[73] Assignee: Avco Everett Research Laboratory, Inc., Everett, Mass.

[21] Appl. No.: 408,393

[22] Filed: Aug. 16, 1982

[51] Int. Cl.³ ............................................. C30B 15/16
[52] U.S. Cl. ...................... 156/617 SP; 156/DIG. 80
[58] Field of Search ......... 156/DIG. 80, 608, 617 SP; 219/121 LF, 121 LV; 148/172

[56] References Cited

U.S. PATENT DOCUMENTS

| | | | |
|---|---|---|---|
| 3,415,636 | 12/1968 | Upton | 65/17 |
| 3,439,968 | 4/1969 | Hansen et al. | 350/1 |
| 4,036,595 | 7/1977 | Lorenzini et al. | 156/617 SP |
| 4,177,372 | 12/1979 | Kotera et al. | 219/121 |
| 4,179,190 | 12/1979 | Friedman et al. | 350/152 |
| 4,181,538 | 1/1980 | Narayan et al. | 148/1.5 |
| 4,221,464 | 9/1980 | Pedinoff et al. | 350/152 |
| 4,252,410 | 2/1981 | Jain | 350/370 |
| 4,309,239 | 1/1982 | Fumeton | 156/617 SP |

FOREIGN PATENT DOCUMENTS 1226473 3/1971 United Kingdom ....... 156/DIG. 80

*Primary Examiner*—Hiram H. Bernstein
*Attorney, Agent, or Firm*—M. E. Frederick

[57] ABSTRACT

A method for laser melting of silicon for the production of boules pulled from a pool of liquid ultraclean or ultrapure silicon wherein the boules are used for producing silicon wafers suitable for use in the electronics field. A laser beam, preferably P polarized, is directed at an angle of about 88 degrees to the normal to the surface of silicon disposed in conventional melting apparatus. A suitable mirror is preferably provided to capture and reflect that portion of the laser beam reflected from the surface of the pool. Use of the present invention permits continuous operation by adding solid silicon and melting it at the point of impingement of the laser beam with up to about 96% absorption of laser energy at this point, thereby permitting the provision of heat in a very controlled manner in a continuous ultraclean silicon crystal growth process.

8 Claims, 3 Drawing Figures

LASER BEAM
FROM
POINT 43

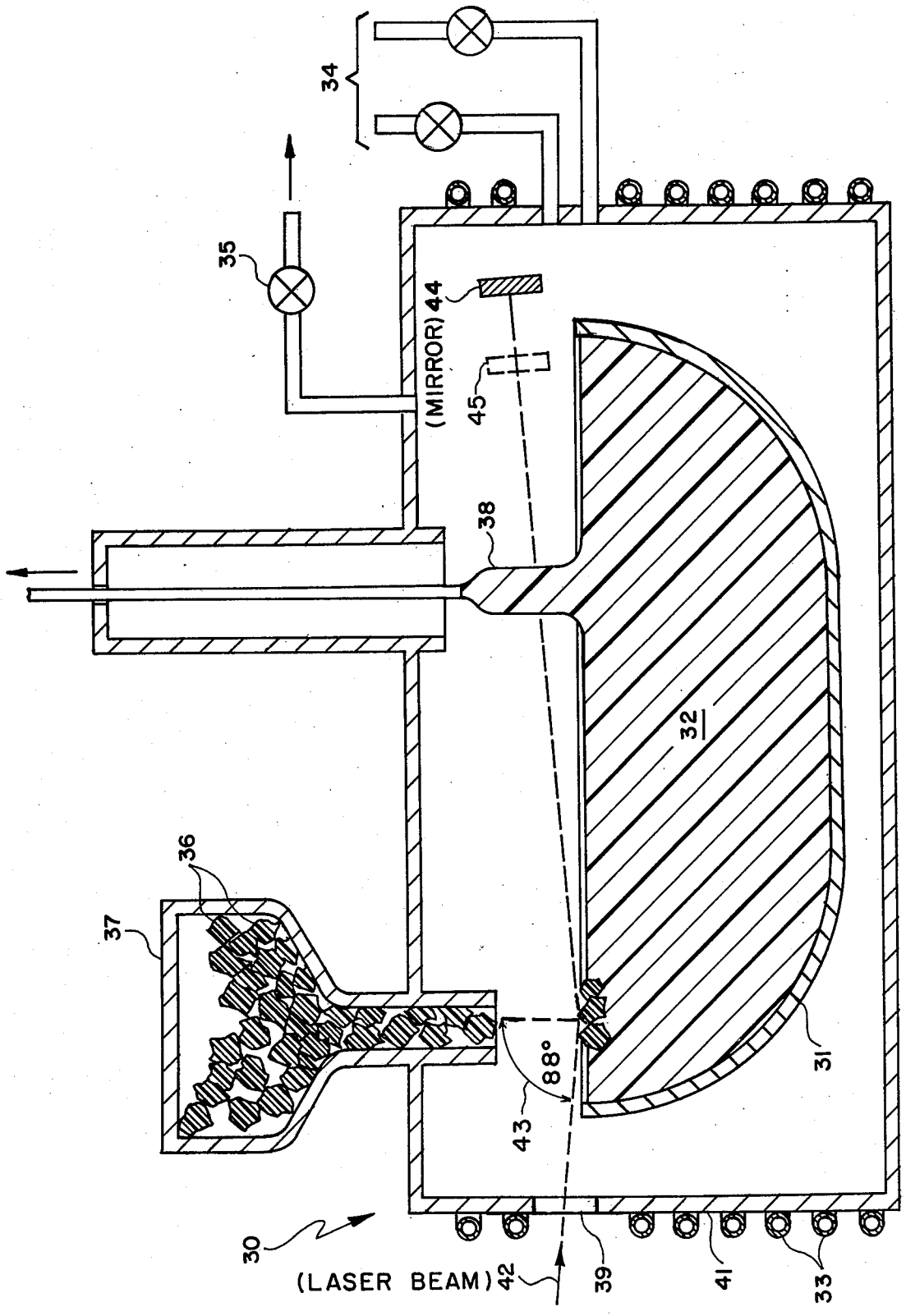

METHOD FOR LASER MELTING OF SILICON

BACKGROUND OF THE INVENTION

This invention relates to a method of melting silicon and, more particularly, to a method of continuously melting ultraclean or ultrapure silicon for the production of single crystal silicon wafers suitable for use in the electronics field.

Silicon wafers used in the electronic field are presently produced by sawing them from single crystal boules pulled from a liquid pool or melt of high purity silicon by a process commonly known as the Czochrolski process. This process is a batch process subject to large end losses due to the fact that generally only short boules can be produced. Because of the necessity of maintaining at all times a liquid pool of silicon having an extremely high degree of purity, refurbishing and replenishing growth between batches is both costly and difficult to execute.

For the above reasons, it wuld be very desirable to have an efficient, low cost, controllable, continuous crystal growth process of ultrapure silicon.

SUMMARY OF THE INVENTION

It is therefore an object of the present invention to effect continuous melting of silicon by laser beam energy wherein up to about 96% of the incident laser beam energy can be absorbed and thereby provide a very efficient, highly controllable, and low cost continuous method of producing ultrapure single crystal silicon material.

To achieve the above-mentioned object, the method according to the present invention is characterized in that ultrapure silicon, in conventional melting apparatus, is irradiated by a laser beam disposed at an angle of preferably about 88 degrees to the normal to the surface of the silicon. This can effect absorption of up to about 96% of the incident energy of a continuous laser beam.

BRIEF DESCRIPTION OF THE DRAWINGS

FIG. 2 is a diagrammatic sectional view of a laser melting chamber in accordance with the invention.

DESCRIPTION OF THE PREFERRED EMBODIMENT

Figure 1:
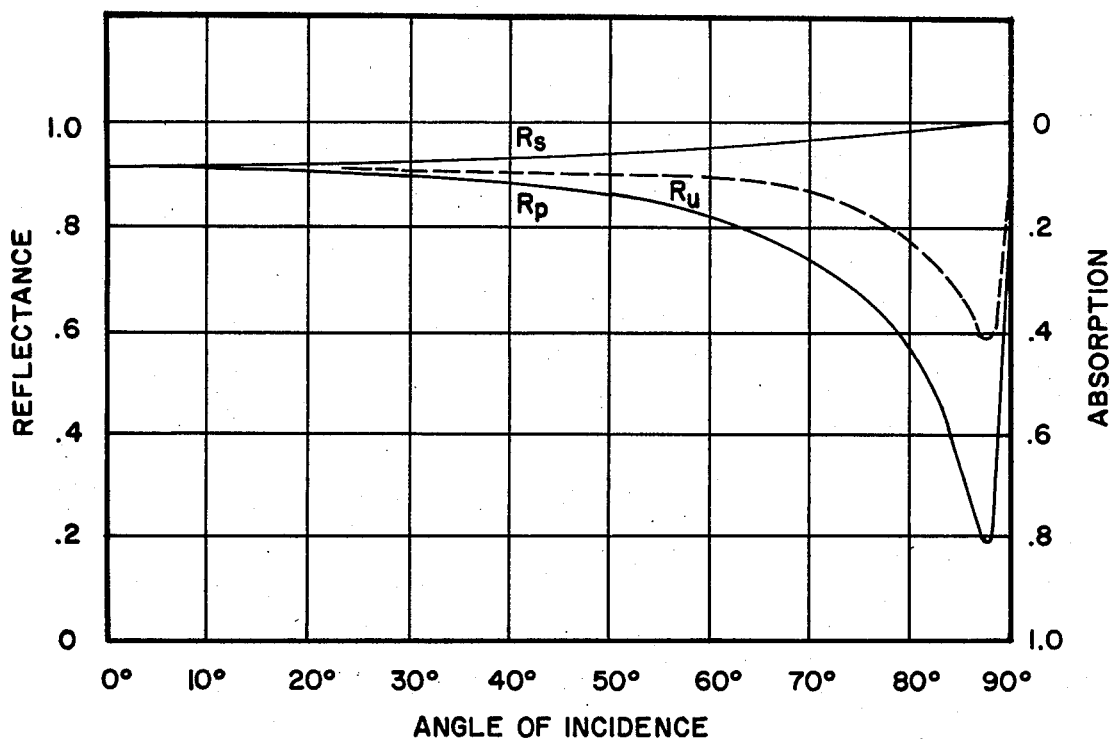
FIG. 1 is a graphic representation showing the reflectivity of a 10.6 micron laser beam from liquid silicon as a function of angle of incidence and polarization.

The above-noted high efficiencies are achievable only if, in accordance with the invention, the laser beam is directed at liquid silicon at preferably an angle of about 88 degrees to the normal to the surface of the silicon. This is because I have determined that liquid silicon does not possess its normal semi-conductor properties, but exhibits high conductivity and high reflectance at normal incidence. I have also determined that liquid silicon exhibits a critical angle of about 88° and at this angle, maximum coupling of optical energy into the liquid silicon can be achieved.

From the optical constants of liquid silicon in the 0.4 to 1.0μ range it has been determined that the free electron density N is $21 \times 10^{+22}$ cm$^{-3}$ and the collision rate $\gamma$ is $4.6 \times 10^{15}$ sec$^{-1}$. Using this electron density N in cm$^{-3}$ and collision rate $\gamma$, the plasma frequency $f_p$ and the collision frequency $f_c$ can be determined from the equations:

$$f_p = 8979\sqrt{N} = 4.1 \times 10^{15} \text{ Hz}$$

$$f_c = \gamma/2\pi = 0.73 \times 10^{15} \text{ Hz}$$

Use of the values of $f_p$ and $f_c$ obtained from the above equations and calculating the frequency of a 10.6μ laser beam from $f = c/\lambda$ where c is the speed of light and $\lambda$ is the wavelength of light ($f = 2.83 \times 10^{13}$ Hz), the real part n and the imaginary part k of the complex index of refraction at any wavelength may be determined from the equations:

$$n = \left\{ \frac{1}{2}\left(1 - \frac{f_p^2}{f^2 + f_c^2}\right) + \frac{1}{2}\left[\left(1 - \frac{f_p^2}{f^2 + f_c^2}\right)^2 + \left(\frac{f_p^2}{f^2 + f_c^2} \frac{f_c}{f}\right)^2\right]^{\frac{1}{2}} \right\}^{\frac{1}{2}}$$

$$k = \left\{ -\frac{1}{2}\left(1 - \frac{f_p^2}{f^2 + f_c^2}\right) + \frac{1}{2}\left[\left(1 - \frac{f_p^2}{f^2 + f_c^2}\right)^2 + \left(\frac{f_p^2}{f^2 + f_c^2} \frac{f_c}{f}\right)^2\right]^{\frac{1}{2}} \right\}^{\frac{1}{2}}$$

Using the above equations n can be determined to be 19.63 and k to be 20.38.

Determining n and k from the above equations, reflectivity as a function of polarization and angle of incidence can be determined by using the Fresnel equations.

The reflectivity for incident light polarized with its electric vector perpendicular to the plane of incidence (the plane which contains the incident ray and the normal to the surface) is $R_s$ and the reflectivity for incident light polarized with its electric vector parallel to the plane of incidence is $R_p$. The angle of incidence $\theta$ is the angle between the incident ray and the normal to the surface. Convenient approximate values of $R_s$ and $R_p$ are given by the equations:

$$R_s = \frac{(n^2 + k^2) - 2n \cos \theta + \cos^2 \theta}{n^2 + k^2 + 2n \cos \theta + \cos^2 \theta}$$

$$R_p = \frac{(n^2 + k^2) \cos^2 \theta - 2n \cos \theta + 1}{(n^2 + k^2) \cos^2 \theta + 2n \cos \theta + 1}$$

The reflectivity for unpolarized light is $R_u$ and is given by the equation:

$$R_u = \frac{1}{2}(R_s \times R_p).$$

Using the above-noted equations and values, FIG. 1 shows the reflectivities $R_s$, $R_p$ and $R_u$ plotted as a function of the angle of incidence $\theta$ for the values of n and k given above.

An inspection of FIG. 1 shows that the angle $\theta$ at which reflectance is a minimum may be expected to be about 88 degrees for $R_p$ (when the incident light is polarized parallel to the plane of incidence). As will also be seen from FIG. 1, at this angle, the absorption may be expected to be greater than about 80% and that, even for unpolarized light reflectance may be expected to be about 40% which is more than about four times better than absorption (9%) at normal incidence. As may be seen from FIG. 1, the absorption maximum is not a point, so that one need not operate precisely at an angle of incidence of 88 degrees. Absorption may be expected to be greater than about 65% if $\theta$ is in the range of 85-89 degrees.

Absorption can be further maximized by the use of a mirror to reflect reflected light coming off the surface of the liquid silicon.

As may now be seen, in accordance with the invention polarized or unpolarized laser beams may be used and a reflecting mirror may be used with or without a quarter wave plate.

Using an unpolarized laser beam, about 41% of the energy may be absorbed with a single pass, about 48% may be absorbed with a 98% reflective mirror and about 81% may be absorbed with a reflecting mirror in combination with a quarter wave plate wherein the reflected laser beam must pass through the quarter wave plate twice.

If a p polarized laser beam is provided, about 82% of of the energy may be absorbed with a single pass and about 96% may be absorbed with the use of a reflecting mirror. A quarter wave plate is not applicable for use with a polarized beam.

Referring now to FIG. 2, there is shown in simplified form a diagrammatic sectional view of a melting chamber 30 having disposed therein a container 31 composed of quartz or the like for retaining ultrapure liquid silicon 32. Melting chamber 30 is provided on its exterior in conventional manner with heater means 33 for maintaining the silicon 32 disposed within the container 31 in liquid form. Other heating forms and arrangements may be used if desired. A quartz container and heating elements disposed on the exterior of the melting chamber are provided in conventional manner to prevent contamination of the liquid silicon. It is essential that only ultrapure silicon be used and that its ultrapure condition be maintained until the boules have been drawn and solidified. The present invention is particularly advantageous in this respect since it provides an efficient means of melting new silicon added to the melt without compromising the purity of the silicon.

Figure 3:
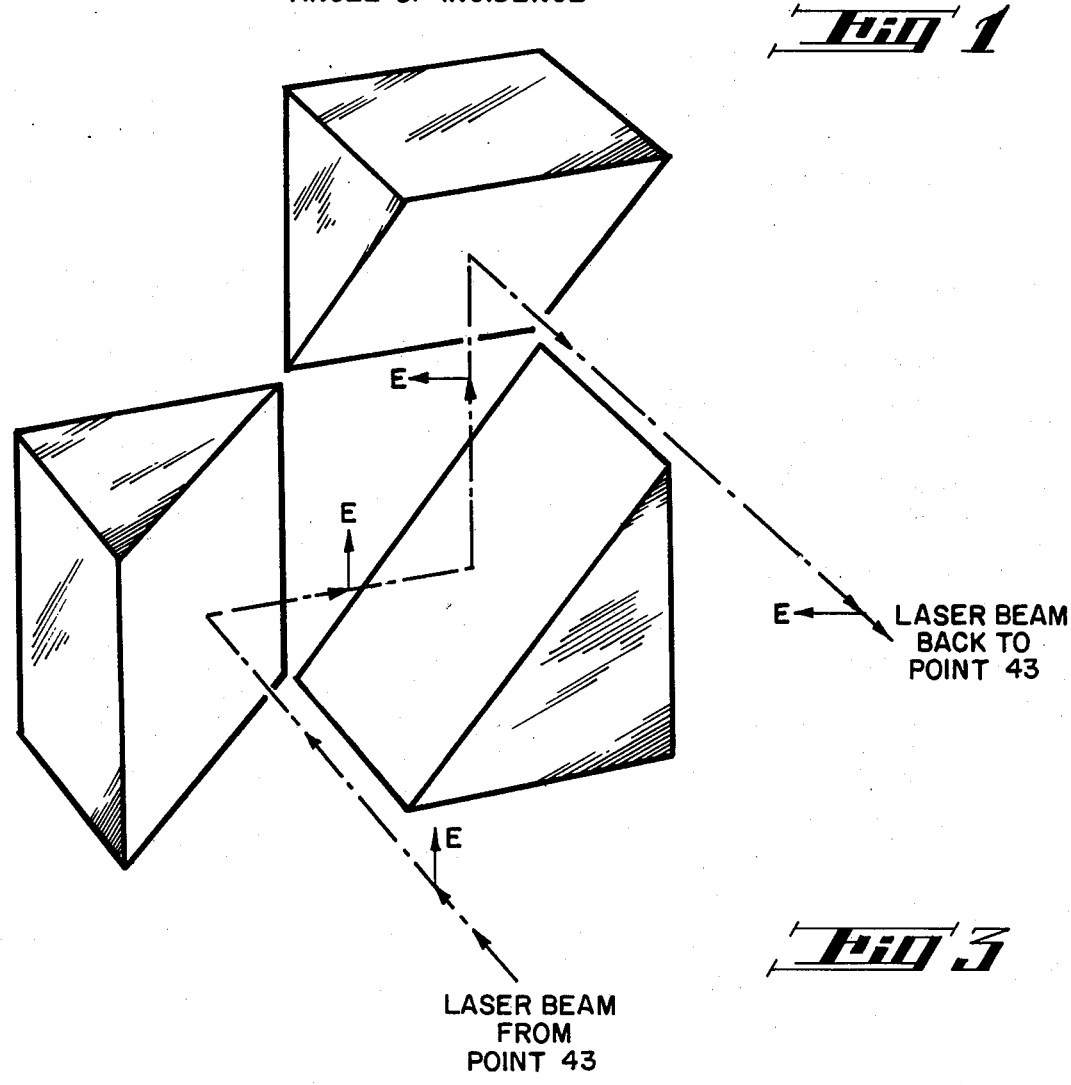
FIG. 3 is a schematic illustration of an alternate three-mirror arrangement for reflecting and rotating the electric vector of the incident laser beam.

A gas supply system 34 is provided to permit introducing into the chamber a suitable gas or gases such as, for example, argon. The chamber is also provided with a vacuum pump system 35 for the evacuation of air and/or contaminated gas. Silicon nuggets 36 for replenishing silicon drawn from the container are introduced as needed by any suitable means from a supply bin 37. A boule 38 is drawn in conventional manner at a point remote from the point at which silicon is supplied to the container. A window 39 is provided in one end wall 41 to permit a suitable laser beam 42, such as, for example, the 10.6$\mu$ laser beam of conventional $CO_2$ laser (not shown) to be introduced with minimum losses into the chamber and impinge on the surface of the silicon at the point 43 where silicon is supplied to the container. The window 39 is located such that the incident laser beam will have an angle of incidence of about 88 degrees. The portion of the incident laser beam reflected off the surface of the silicon is reflected back to its point of incidence 43 by a mirror 44 suitably carried within the melting chamber 30. For maximum absorption, a quarter wave plate 45, shown in broken lines, is disposed in front of the mirror 44 in the event an unpolarized laser beam is used. The quarter wave plate is placed so that the reflected laser beam must pass through it twice. If desired, the effect of the quarter wave plate 45 and simple mirror 44 in combination may be replaced with a three mirror combination as shown in FIG. 3 effective to provide the same reflectance but rotate the laser beam electric vector the same as that of the quarter wave plate.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

I claim:

1. In the method of producing single crystal boules of silicon wherein said boules are drawn from a pool of liquid silicon disposed within a melting chamber, the steps comprising:
   (a) supplying heat to said silicon pool to substantially maintain it in liquid form;
   (b) introducing silicon in solid form at a predetermined point in said silicon pool;
   (c) drawing a boule from said silicon pool at a point remote from the point at which said solid silicon is introduced; and
   (d) introducing a laser beam into said melting chamber to impinge on the surface of said silicon pool at the point at which said solid silicon is introduced into said silicon pool to melt said solid silicon, said laser beam having an angle of incidence of about 88°.

2. The method of claim 1 wherein said laser beam is polarized.

3. The method of claim 1 wherein said laser beam is polarized with its electric vector parallel to the plane of incidence.

4. The method of claim 1 wherein the angle of incidence of said laser beam is in the range of about 85° to 89°.

5. The method of claim 2 wherein substantially the laser beam reflected from the surface of said silicon pool is reflected back to the point of impingement of said laser beam.

6. The method of claim 1 wherein said laser beam is unpolarized and the laser beam reflected from the surface of said silicon pool is reflected back to its point of impingement with its electric vector rotated substantially ninety degrees.

7. The method of claim 6 wherein the laser beam reflected back to its point of impingement is reflected and its electric vector rotated said ninety degrees by a multiple mirror arrangement comprising at least three reflective surfaces.

8. The method of claim 6 wherein the laser beam reflected back to its point of impingement is reflected by a mirror and its electric vector is rotated said ninety degrees by a quarter wave plate disposed between the mirror and the point of impingement of the laser beam and through which said reflected laser beam passes.

* * * * *

UNITED STATES PATENT AND TRADEMARK OFFICE
CERTIFICATE OF CORRECTION

PATENT NO. : 4,468,279
DATED : August 28, 1984
INVENTOR(S) : Irving Itzkan

It is certified that error appears in the above-identified patent and that said Letters Patent are hereby corrected as shown below:

Column 1, line 21, for "wuld" read --would--;
Column 2, line 67, for "$R_U = 1/2 (R_s \times R_p)$"
read --$R_U = 1/2 (R_s + R_p)$--; Column 3, line 31, delete "of".

Signed and Sealed this

Fifth Day of March 1985

[SEAL]

*Attest:*

DONALD J. QUIGG

*Attesting Officer*     *Acting Commissioner of Patents and Trademarks*